(12) United States Patent
Kleint et al.

(10) Patent No.: US 7,678,654 B2
(45) Date of Patent: Mar. 16, 2010

(54) BURIED BITLINE WITH REDUCED RESISTANCE

(75) Inventors: Christoph Kleint, Dresden (DE); Clemens Fitz, Dresden (DE); Ulrike Bewersdorff-Sarlette, Radebeul (DE); Christoph Ludwig, Langebrück (DE); David Pritchard, Dresden (DE); Torsten Müller, Dresden (DE); Hocine Boubekeur, Dresden (DE)

(73) Assignee: Qimonda AG, Munich (DE)

( * ) Notice: Subject to any disclaimer, the term of this patent is extended or adjusted under 35 U.S.C. 154(b) by 352 days.

(21) Appl. No.: 11/478,313

(22) Filed: Jun. 30, 2006

(65) Prior Publication Data

US 2008/0002466 A1 Jan. 3, 2008

(51) Int. Cl.
*H01L 21/8247* (2006.01)
*H01L 29/792* (2006.01)

(52) U.S. Cl. ............ 438/287; 257/E21.18; 257/E21.21; 257/E21.423; 257/E21.679; 438/216

(58) Field of Classification Search .......... 257/E21.679, 257/E21.18, E21.21, E21.423; 438/216, 438/287
See application file for complete search history.

(56) References Cited

U.S. PATENT DOCUMENTS

| 6,531,361 | B1 | 3/2003 | Liu et al. |
|---|---|---|---|
| 6,653,227 | B1 | 11/2003 | Lai et al. |
| 6,686,242 | B2 | 2/2004 | Willer et al. |
| 6,734,063 | B2 | 5/2004 | Willer et al. |
| 6,953,963 | B2 * | 10/2005 | Wang et al. .................. 257/315 |
| 6,958,272 | B2 * | 10/2005 | Lingunis et al. ............. 438/257 |
| 6,958,510 | B2 * | 10/2005 | Pascucci ...................... 257/311 |
| 6,967,133 | B2 * | 11/2005 | Amon et al. ................ 438/230 |
| 6,987,048 | B1 | 1/2006 | Cheng et al. |
| 7,125,763 | B1 * | 10/2006 | Sobek et al. ................ 438/201 |
| 7,183,606 | B2 * | 2/2007 | Wang et al. .................. 257/315 |
| 7,315,474 | B2 * | 1/2008 | Lue ......................... 365/185.18 |
| 7,414,277 | B1 * | 8/2008 | Melik-Martirosian et al. ............................. 257/288 |
| 7,626,227 | B2 * | 12/2009 | Kouketsu et al. ............ 257/324 |
| 2002/0182829 | A1 * | 12/2002 | Chen .......................... 438/514 |
| 2003/0119314 | A1 | 6/2003 | Ogura et al. |
| 2006/0198189 | A1 * | 9/2006 | Lue et al. ................ 365/185.12 |
| 2006/0202252 | A1 * | 9/2006 | Wang et al. .................. 257/314 |
| 2006/0202261 | A1 * | 9/2006 | Lue et al. ..................... 257/324 |
| 2006/0281255 | A1 * | 12/2006 | Chiu et al. ................... 438/257 |
| 2007/0212833 | A1 * | 9/2007 | Lu et al. ...................... 438/257 |

* cited by examiner

*Primary Examiner*—Anh Phung
*Assistant Examiner*—Michael Lulis
(74) *Attorney, Agent, or Firm*—Edell, Shapiro & Finnan LLC

(57) ABSTRACT

A memory cell array includes a number of memory cells, each of the memory cells including a source and a drain region defined by corresponding bitlines within a semiconductor substrate. Each of the bitlines has a doped semiconductor region as well as a conductive region in direct electrical contact with the doped semiconductor region.

7 Claims, 7 Drawing Sheets

US 7,678,654 B2

BURIED BITLINE WITH REDUCED RESISTANCE

FIELD OF THE INVENTION

The present invention relates to a buried bitline with reduced resistance for a memory cell array and a fabrication method thereof.

BACKGROUND

One of the main goals in technology development of semiconductor memory cells is to reduce the size of the memory cells in order to increase their density on a semiconductor wafer, thereby reducing the costs per bit. When downscaling a memory cell comprising buried bitlines, however, cross-sectional areas of these buried bitlines also decrease leading to an undesirable increase of their electrical resistance. A buried bitline with reduced resistance as well as a fabrication method thereof would be highly desirable.

SUMMARY

The present invention inter alia suggests a buried bitline with reduced resistance and a fabrication method thereof. According to the present invention a memory cell array comprises a plurality of memory cells, each of the memory cells comprising a source and a drain region defined by corresponding bitlines within a semiconductor substrate, each of the bitlines comprising a doped semiconductor region as well as a conductive region formed within the doped semiconductor region, wherein the conductive region comprises a composition of matter different from the doped semiconductor region, the conductive region being shared by at least two of the plurality of memory cells arranged along a direction of a corresponding bitline.

An advantage of an embodiment of the present invention is achieved by a memory cell array comprising a plurality of flash memory cells, each of the memory cells comprising a source and a drain region defined by corresponding bitlines, each of the bitlines comprising a doped semiconductor region within a semiconductor substrate as well as a conductive region formed directly on the doped semiconductor region, wherein the conductive region is shared by at least two of the plurality of memory cells arranged along a direction of a corresponding bitline.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily drawn to scale relative to each other. Like reference numerals designate corresponding similar parts.

DETAILED DESCRIPTION

Figure 1A:
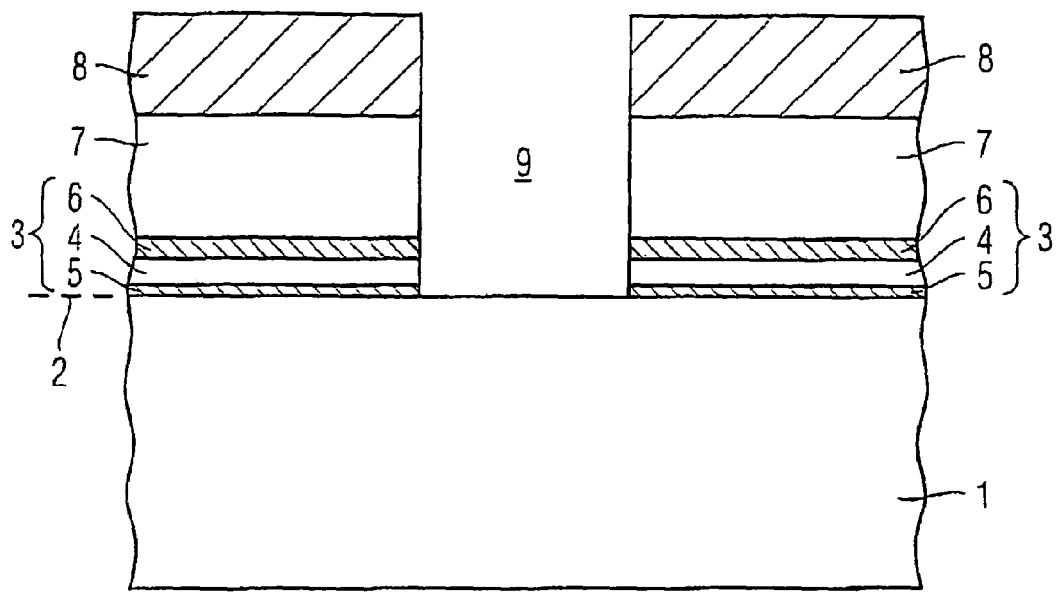
FIGS. 1A to 1H show schematic cross-sectional views illustrating subsequent process steps during fabrication of a buried bitline of a flash memory cell with reduced resistance according to a first embodiment of the invention.

According to the present invention a memory cell array comprises a plurality of memory cells, each of the memory cells comprising a source and a drain region defined by corresponding bitlines within a semiconductor substrate, each of the bitlines comprising a doped semiconductor region as well as a conductive region formed within the doped semiconductor region, wherein the conductive region comprises a composition of matter different from the doped semiconductor region, the conductive region being shared by at least two of the plurality of memory cells arranged along a direction of a corresponding bitline. Preferably, the conductive region is continuously formed along a corresponding bitline. However, interruptions may also be provided.

A difference with respect to the composition of matter between the doped semiconductor region and the conductive region may be due to a component of the conductive region that is not present inside the doped semiconductor region. The doped semiconductor region is in direct electrical contact with the conductive region. The plurality of memory cells may be positioned along columns and rows defining the array, for example. The bitlines may proceed along the rows or columns, for example.

It is further advantageous, if the doped semiconductor region comprises at least one doped semiconductor zone. In case the doped semiconductor region comprises multiple doped semiconductor zones, these zones may be optimized with respect to an overall junction profile taking influence on the electrical characteristic of the memory cells. Each one of the buried bitlines may serve as a source/drain region of a memory cell comprising its channel region to the left of the buried bitline and as a source/drain region of a further memory cell comprising its channel region to the right of the bitline, for example.

According to a further aspect of the invention, the conductive region comprises a lateral spacing to side walls of the doped semiconductor region as well as a vertical spacing to a bottom side of the doped semiconductor region, the conductive region extending to a surface of the semiconductor substrate. Electrical contact to the doped semiconductor region may be provided by the conductive region, the conductive region being directly connected via the substrate surface to a contact plug, for example.

According to a particularly preferred embodiment, the conductive region comprises a silicide. Due to a low resistivity of well known silicides compared to doped silicon, a significant reduction of the resistance in comparison with bitlines exclusively formed of doped semiconductor zones may be achieved.

It is particularly advantageous, if the conductive region comprises $CoSi_2$. It is further advantageous, if the $CoSi_2$ is single crystalline or polycrystalline.

According to a further embodiment of the invention, the conductive region comprises a sheet resistance in $\Omega$/square being at least five times smaller compared to the sheet resistance of the doped semiconductor region. Thus, it is possible to achieve an appropriate resistance of the buried bitlines also when downscaling to smaller feature sizes.

According to an embodiment of the invention, a method of forming buried bitlines of a flash memory cell array is provided, the method comprising: providing a semiconductor substrate comprising a structure of a dielectric layer stack formed on a surface of the semiconductor substrate, a conductive layer formed on the dielectric layer stack and a cap layer formed on the conductive layer, forming trenches into the structure to expose part of the semiconductor substrate, forming at least one mediation layer on the structure and on the exposed part of the semiconductor substrate, forming at least one metal layer on the at least one mediation layer, implementing at least one annealing step so as to diffuse metal atoms from the at least one metal layer through the at least one mediation layer into the semiconductor substrate to form a conductive region therein, removing the at least one metal layer and the at least one mediation layer, forming an insulating spacer structure covering side walls of the trenches, forming a doped semiconductor region within the exposed part of the semiconductor substrate so as to embed the conductive region, filling up the trenches with a dielectric material and removing the cap layer, part of the insulating spacer structure and part of the dielectric material to expose the conductive layer.

The dielectric layer stack may serve as a charge storage region of the memory cell and the conductive layer may be further processed to provide wordlines.

It is particularly advantageous if the dielectric layer stack is formed as a stack comprising oxide/nitride/oxide layers, wherein charge is stored within the nitride layer due to its low carrier mobility.

It is furthermore advantageous if the at least one metal layer is formed of Co. Co allows for a low resistivity silicide, thus enabling an appropriate reduction of the resistance of a buried bitline by forming the conductive region of $CoSi_2$.

It is furthermore advantageous, if the conductive layer is formed of doped polycrystalline silicon. Doped polycrystalline silicon is well known in silicon technology, e.g., as a material for a gate of a MOS (metal-oxide-semiconductor) transistor.

It is particularly advantageous, if the at least one mediation layer is formed of one of the group consisting of Ti and oxide of silicon. Such a mediation layer allows for a favorable mediated epitaxy leading to single crystalline $CoSi_2$ within the semiconductor substrate below a substrate surface. Formation of the $CoSi_2$ is carried out as a salicide (self-aligned silicide) process providing for a self-alignment of the doped semiconductor region with respect to the conductive region. The use of epitaxial $CoSi_2$ is furthermore advantageous with respect to a temperature stability requirement as activation anneals may be implemented later in the process flow.

It is furthermore advantageous if the doped semiconductor region is formed by implanting dopants.

In addition, or as an alternative, it may be provided that in a further advantageous development, the doped semiconductor region is formed by utilizing the conductive region as a dopant source for diffusing dopants from the conductive region into the semiconductor region to be doped. Thus, the conductive region serves as a dopant source for the formation of a source/drain region corresponding to the buried bitline.

It is furthermore advantageous, if further dopants are implanted into the semiconductor substrate to form pocket regions in edge regions of the exposed part of the semiconductor substrate. These pocket regions may be part of the doped semiconductor region and may serve to optimize a junction profile with respect to the electrical characteristics of the memory cells, e.g. adjusting an electric field distribution at a drain region in view of hot carrier generation.

It is furthermore advantageous, if the dopants of the semiconductor region are implanted before or after or partly before and partly after formation of the insulating spacer structure. A sequence of implantations may be appropriately chosen under consideration of a width of the trenches as well as the insulating spacer structure, for example. However, further aspects may influence process integration of the implantations.

According to a further preferred embodiment of the invention, a memory cell array comprises a plurality of memory cells, each of the memory cells comprising a source and a drain region defined by corresponding bitlines, each of the bitlines comprising a doped semiconductor region within a semiconductor substrate as well as conductive region formed directly on the doped semiconductor region, wherein the conductive region is shared by at least two of the plurality of memory cells arranged along a direction of a corresponding bitline. The conductive region may be provided between dielectric layer stacks and wordlines of two neighboring memory cells, insulated therefrom, for example. Preferably, the conductive region is continuously formed along a corresponding bitline. However, interruptions may also be provided.

It is particularly advantageous, if the conductive region adjoins laterally to an insulating spacer structure. The spacer structure may isolate the conductive region from a dielectric layer stack and a wordline, for example.

According to a further aspect of the invention, the conductive region comprises a doped epitaxial semiconductor layer. Epitaxy of the semiconductor layer, e.g., a doped silicon layer, allows for a favourable alignment of its thickness, for example.

It is furthermore advantageous, if the conductive region comprises a doped polycrystalline semiconductor layer.

It is particularly advantageous, if the conductive region comprises a sheet resistance in ohm/square being smaller compared to the sheet resistance of the doped semiconductor region. Thus, a reduction of the resistance of the buried bitline may be achieved by a parallel connection of the conductive region and the doped semiconductor region along a corresponding bitline.

According to a further aspect of the invention, a method of forming buried bitlines of a flash memory cell array is provided, the method comprising providing a semiconductor substrate comprising a structure of a dielectric layer stack formed on a surface of the semiconductor substrate, a conductive layer formed on the dielectric layer stack and a cap layer formed on the conductive layer, forming trenches into the structure to expose part of the semiconductor substrate, forming an insulating spacer structure covering sidewalls of the trenches, forming a doped semiconductor region within the exposed part of the semiconductor substrate, forming a conductive region within the trenches on the doped semiconductor region, the conductive region partially filling up the trenches, and filling up the trenches with the dielectric material and removing the cap layer, part of the insulating spacer structure and part of the dielectric material to expose the conductive layer.

Further process steps may provide an electrical contact of the buried bitlines to a metal layer by contact plugs, for example, in order to connect the memory cell array to further circuit parts.

It is particularly advantageous if the conductive region is formed up to a height that is below top of the conductive layer. Removal of the cap layer will thus not affect the conductive region.

It is even more advantageous if the conductive region is formed up to a height that is below top of the dielectric layer stack.

It is furthermore advantageous if the conductive region is formed by selective epitaxial growth. This allows for a favorable adjustment of the thickness of the conductive region.

In addition, or as an alternative, it is further advantageous, if the step of forming the conductive region comprises the steps of filling up the trenches with a conductive material and implementing a recess etch, thereby removing part of the conductive material to provide the conductive region. The conductive region may be chosen as doped polycrystalline silicon, for example. However, other conductive materials may be used.

It is particularly advantageous if the dielectric layer stack is formed as a stack comprising oxide/nitride/oxide layers. The dielectric layer stack may provide a charge storage region for flash memory cells.

It is furthermore advantageous if the doped semiconductor region is formed by implanting dopants.

It is particularly advantageous, if dopants are implanted into the semiconductor substrate to form pocket regions in edge regions of the exposed part of the semiconductor substrate. The pocket regions may be part of the doped semiconductor region. The pocket regions may be used to optimize a junction profile with respect to the electrical characteristics of the memory cells, for example.

In the following detailed description, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

FIGS. 1A to 1H illustrate an embodiment of a method of forming a bitline of a flash memory cell array according to an exemplary embodiment of the invention. These figures illustrate, by way of example, schematic cross-sectional views of subsequent process operations during fabrication of a buried bitline with reduced resistance. Although the cross-sectional views merely show the fabrication of a single bitline in order to increase clarity and intelligibility of the figures, there may be provided a plurality of bitlines simultaneously.

Referring to FIG. 1A, there is provided a semiconductor substrate 1 having a substrate surface 2. The semiconductor substrate 1 may be of silicon, for example. However, many other semiconductor materials such as Ge, SiGe, SiC, III-V compound semiconductors, such as GaAs or further compound semiconductors may be used. On top of the semiconductor substrate 1 there is formed a dielectric layer stack 3 used as a charge storage region for the flash memory cells to be fabricated. The dielectric layer stack 3 comprises a so-called ONO-stack, namely a nitride layer 4 formed between two oxide layers 5, 6. However, the dielectric layer stack 3 may also comprise further materials suitable to form a charge storage region. On top of the dielectric layer stack 3, there is provided a conductive layer 7 that may be used to provide wordlines for the memory cells in a later process stage not further elucidated herein. As a material for the conductive layer, doped polycrystalline silicon may be used, for example. However, many other conductive materials may be used, e.g., conducting or semiconducting materials. On top of the conductive layer 7, there is provided a cap layer 8 serving as a hardmask for the conductive layer 7 with regard to subsequent process steps. The cap layer 8 may be formed as a nitride layer, for example.

In order to partly expose the substrate surface 2, a trench 9 is formed into the cap layer 8, the conductive layer 7 and the dielectric layer stack 3.

Figure 1B:
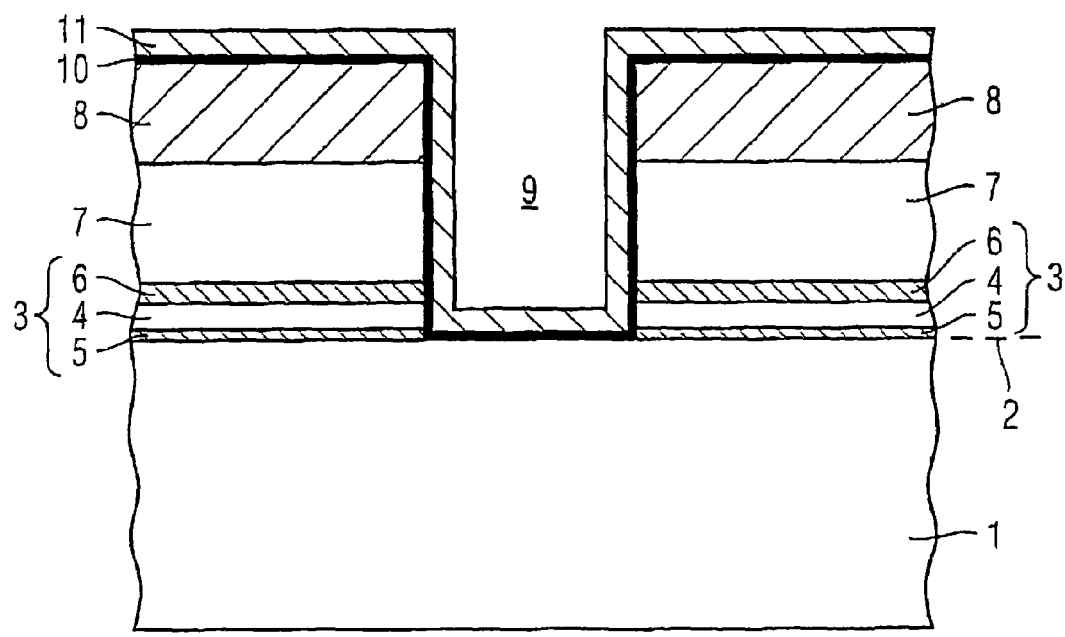

Referring to FIG. 1B, there is formed a mediation layer 10 covering side walls and a bottom side of the trench 9 as well as the cap layer 8. The mediation layer 10 may be chosen as an appropriate material suitable for permitting the formation of a conductive region to be formed within the semiconductor substrate. On top of the mediation layer 10 there is formed a metal layer 11. The metal layer 11 serves as a material source for subsequent formation of a silicide constituting the conductive region. The metal layer 11 may be formed of Co, and the mediation layer 10 may be formed of Ti or an oxide of silicon, for example. However, further materials may be used that allow for a salicide process (self-aligned silicide process) to define the conductive region within the semiconductor substrate 1.

Figure 1C:
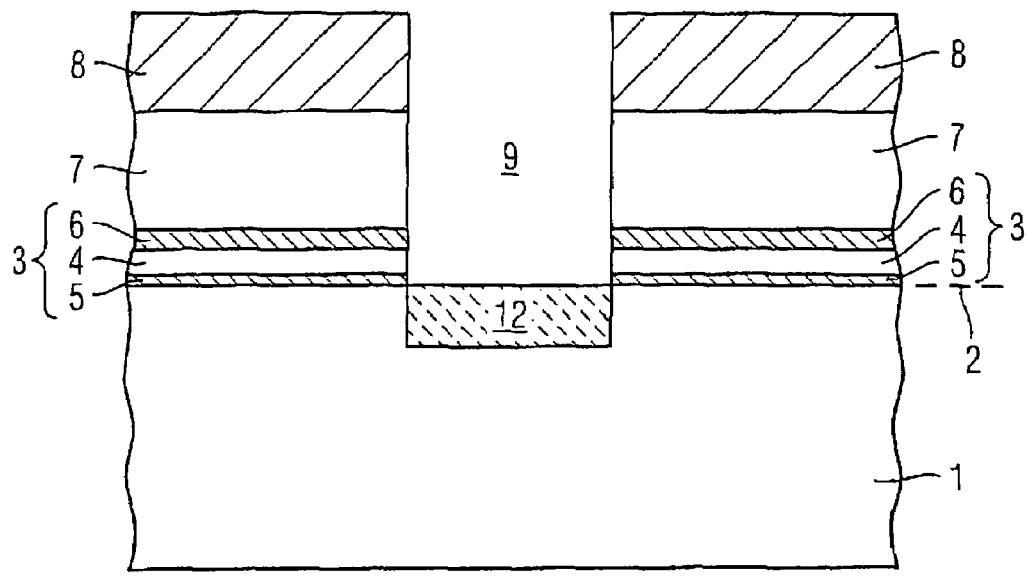

During the salicide process, metal atoms from the metal layer 11 diffuse into the semiconductor substrate 1 through the mediation layer 10 (see FIG. 1B) to form the silicide constituting the conductive region 12, see FIG. 1C. The conductive region 12 may comprise single crystalline $CoSi_2$ formed during a one or two step salicide process using Ti or an oxide layer as the mediation layer 10 and a Co layer as the metal layer 11 leading to an Ti or oxide mediated epitaxy of $CoSi_2$. FIG. 1C illustrates a process stadium, after formation of the conductive region 12. The metal layer 11 as well as the mediation layer 10 are removed, e.g., by a one or two-step etch process.

Figure 1D:
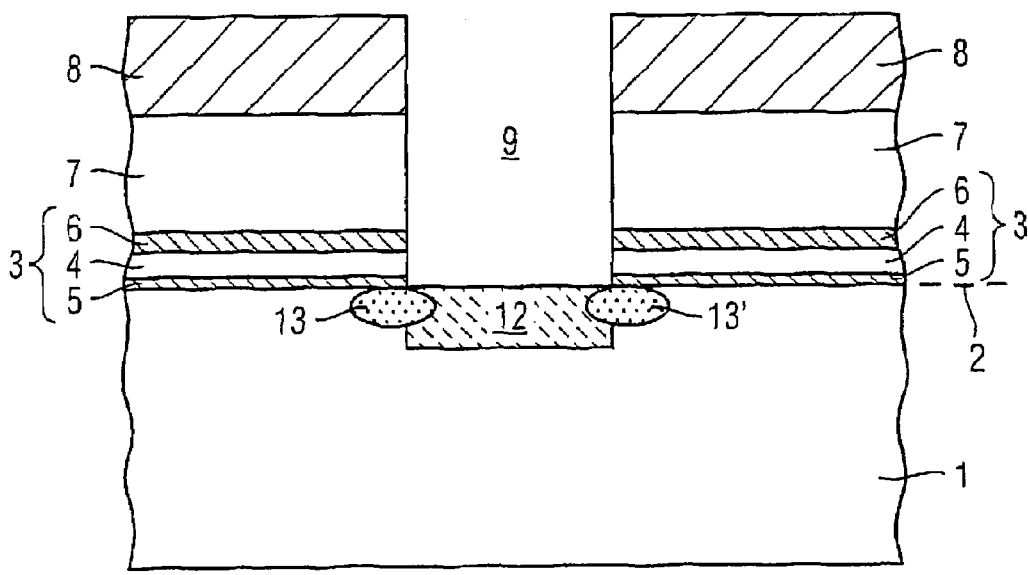

With reference to the cross-sectional view of FIG. 1D, pocket regions 13, 13' are formed within the semiconductor substrate 1 in edge regions of the exposed part of the semiconductor substrate 1. The pocket regions 13, 13' may be provided by two separate tilted implantations, for example. The pocket regions 13, 13' may serve to adjust an appropriate junction profile with regard to an electric field distribution, for example.

Figure 1E:
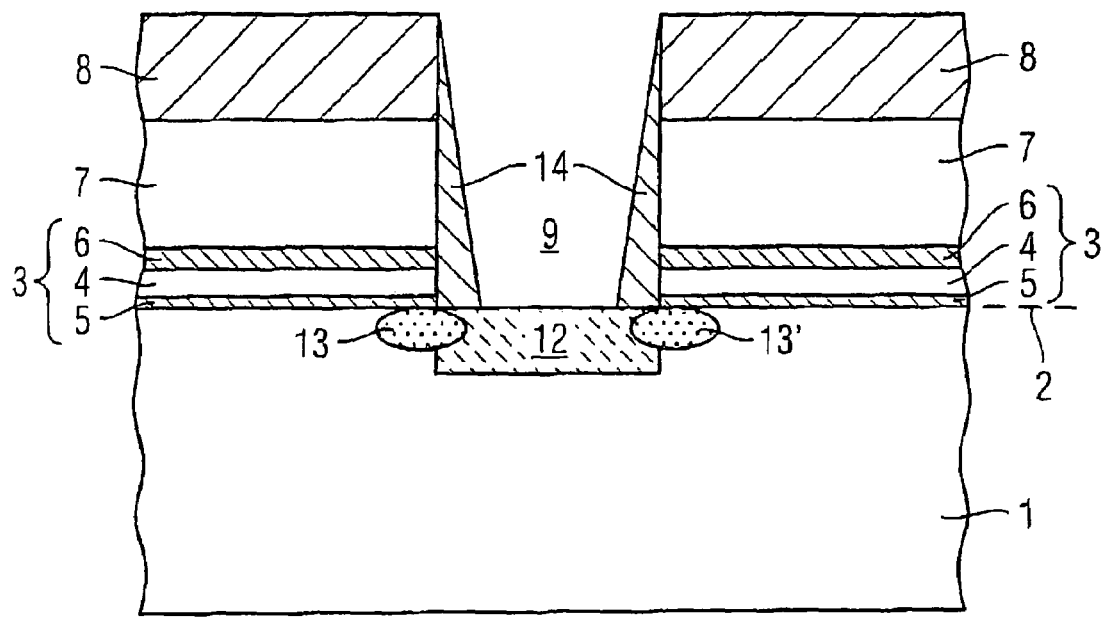

Referring to FIG. 1E, an insulating spacer structure 14 is formed at side walls of the trench 9. The insulating spacer structure 14 may be of TEOS (tetra-ethoxysilane), for example. However, other insulating materials may be used. The insulating spacer structure 14 may be fabricated in a two-step process, namely a first deposition step followed by a second etch step to define the insulating spacer structure 14 as a remainder, for example.

Figure 1F:
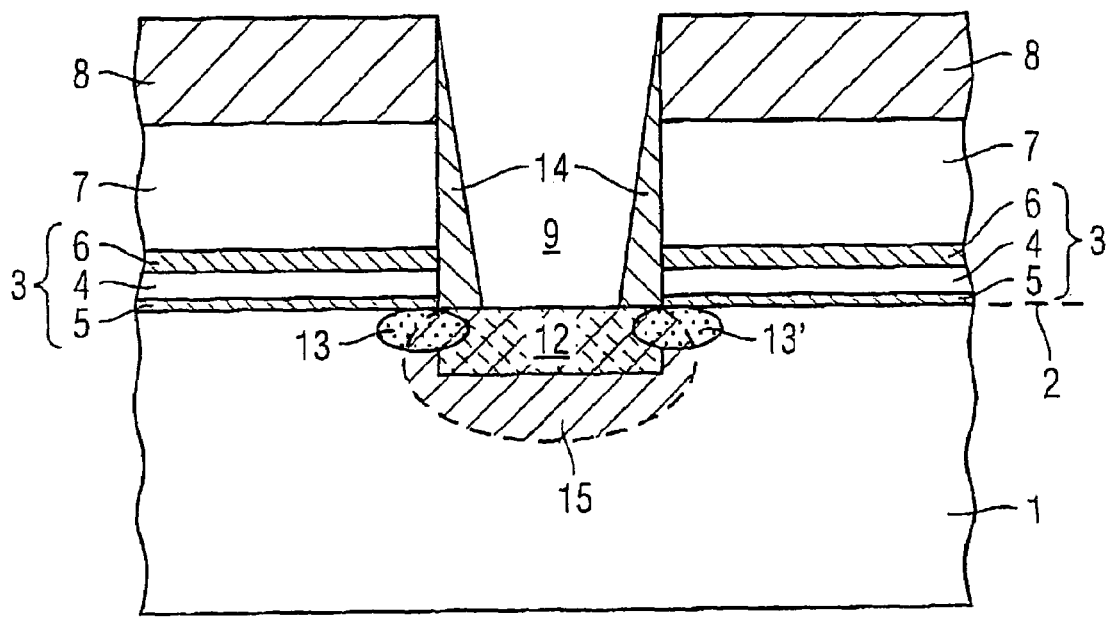

Referring to FIG. 1F, a doped semiconductor zone 15 is formed within the semiconductor substrate 1. The semiconductor zone 15 may be defined by implanting dopants into the semiconductor substrate 1 or by using the conductive region 12 as a dopant source, from where dopants are outwardly diffused to define the doped semiconductor zone 15. The doped semiconductor zone 15 overlaps with the pocket regions 13, 13' defining a doped semiconductor region. The conductive region 12 is embedded in the doped semiconductor region, both regions defining a buried bitline. The doped semiconductor region serves as a source/drain region for the memory cells. In the present example, the doped semiconductor region comprising the pocket regions 13, 13' as well as the doped semiconductor zone 15 is shared by two neighboring memory cells. To the left of the doped semiconductor region, there is provided a channel region of a memory cell having a respective part of the dielectric layer stack 3 as a charge storage region formed thereon. To the right of the doped semiconductor region there is provided a further channel region of a further memory cell having a corresponding part of the dielectric layer stack 3 as a charged storage region formed thereon. Along the buried bitline there may be provided a plurality of memory cells (not shown in the simplified cross-sectional view). The conductive region 12 significantly reduces the resistance of the buried bitline. It is advantageous to embed the conductive region 12 within the doped semiconductor region such that the conductive region 12 does not deteriorate, e.g., via its influence on the junction profile, the electrical characteristics of the memory cells.

Figure 1G:
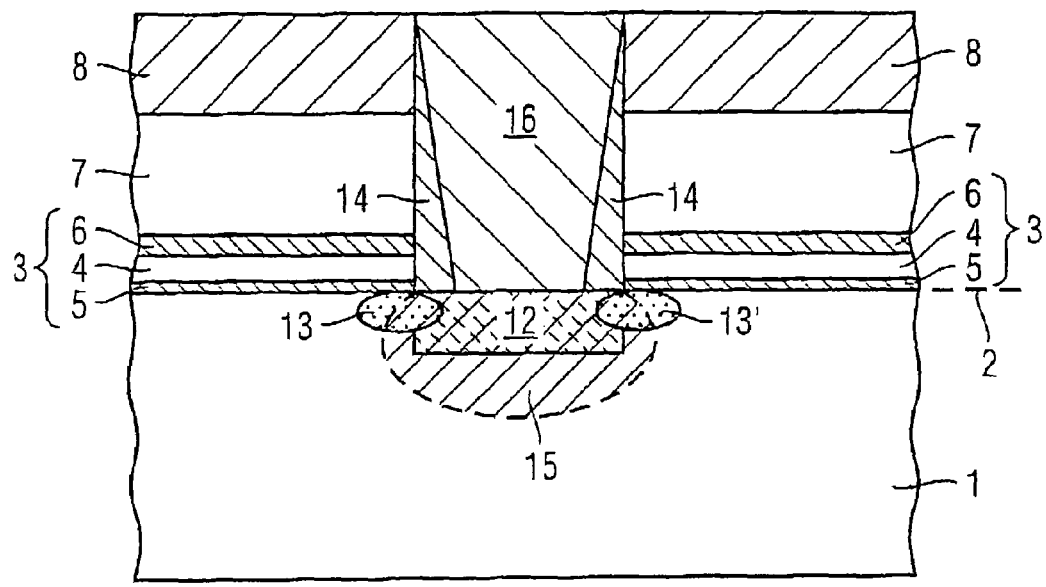

After formation of the doped semiconductor zone 15, the trench 9 is filled up with a dielectric material 16, see FIG. 1G. The dielectric material 16 may be chosen as TEOS, for example. However, other dielectric materials may naturally also be used.

Figure 1H:
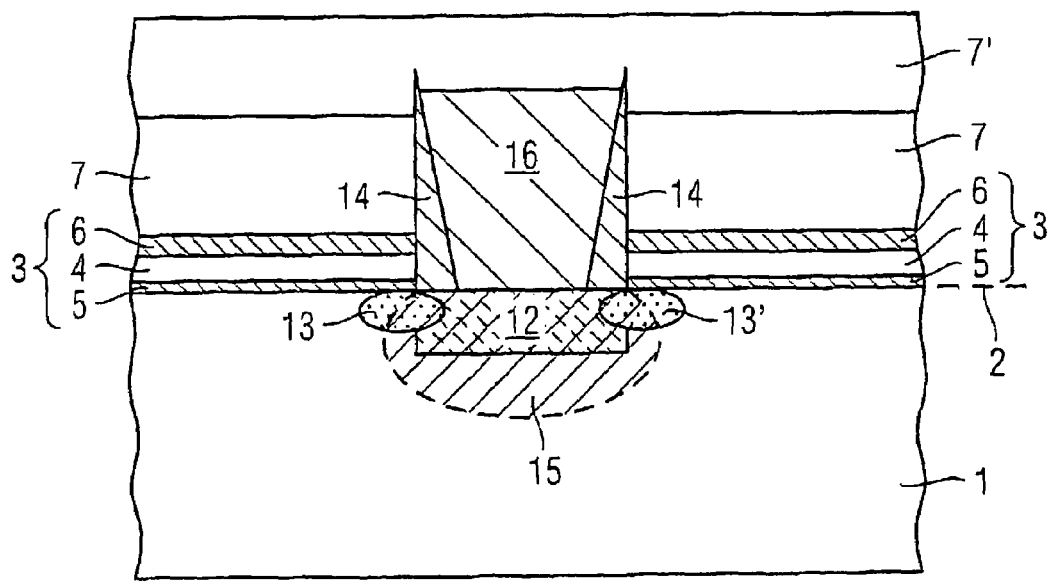

Reference is now made to FIG. 1H. After filling up the trench 9 with the dielectric material 16 (see FIG. 1G), the cap layer 8 as well as part of the insulating spacer structure 14 and the dielectric material 16 is removed to expose the conductive layer 7. The removal may be performed by CMP (chemical mechanical polishing), for example. On top of the exposed conductive layer 7, a further conductive layer 7' is formed. The further conductive layer 7' may be of the same material as the conductive layer 7. Both layers 7, 7' may be of polycrystalline silicon, for example. The conductive layers 7, 7' may serve as a material to be patterned in later process steps when defining wordlines of the memory cell array.

FIGS. 2A to 2E show schematic cross-sectional views elucidating subsequent process steps during formation of a buried bitline of a flash memory cell array according to a further exemplary embodiment of the invention.

Figure 2A:
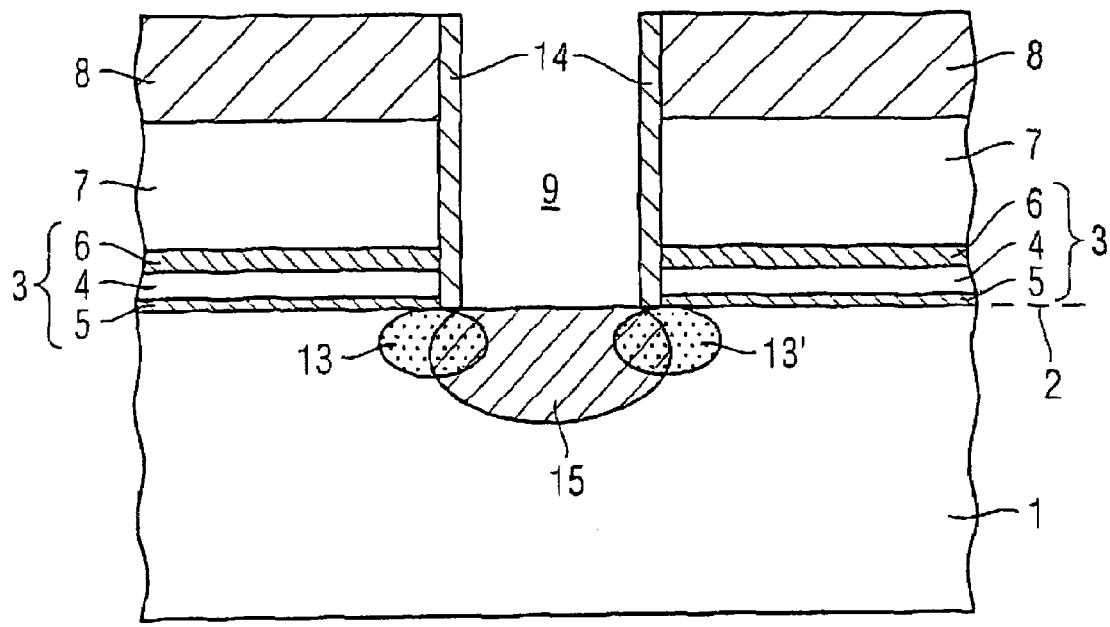
FIGS. 2A-2E show schematic cross-sectional views of subsequent process steps during fabrication of a buried bitline of a flash memory cell with reduced resistance according to a further embodiment of the invention.

Reference is now made to FIG. 2A. On top of the semiconductor substrate 1, there is provided a dielectric layer stack 3. The dielectric layer stack 3 comprises two oxide layers 5, 6 with a nitride layer 4 sandwiched in between. On top of the dielectric layer stack 3, there is formed the conductive layer 7. On top of the conductive layer 7 is formed the cap layer 8. A trench 9 is shaped within the cap layer 8, the conductive layer 7 as well as the dielectric layer stack 3 to expose part of the substrate surface 2 of the semiconductor substrate 1. The spacer structure 14 covers sidewalls of the trench 9. Inside the semiconductor substrate 1, there is formed the doped semiconductor zone 15 overlapping with pocket regions 13, 13' that are formed in edge regions of the exposed part of the semiconductor substrate 1. A doped semiconductor region comprising the doped semiconductor zone 15 as well as the pocket regions 13, 13' defines a source/drain region that is shared by two neighboring memory cells. In the present illustration these two memory cells are formed to the left and to the right of the trench 9. Thus, a first memory cell is positioned to the left of the trench 9 comprising the respective left part of the dielectric layer stack 3 as a charge storage region, whereas a second memory cell is positioned to the right of the trench 9 comprising the corresponding right part of the dielectric layer stack 3 as the charge storage region. Both memory cells share the doped semiconductor region as a buried bitline and source/drain region.

Figure 2B:
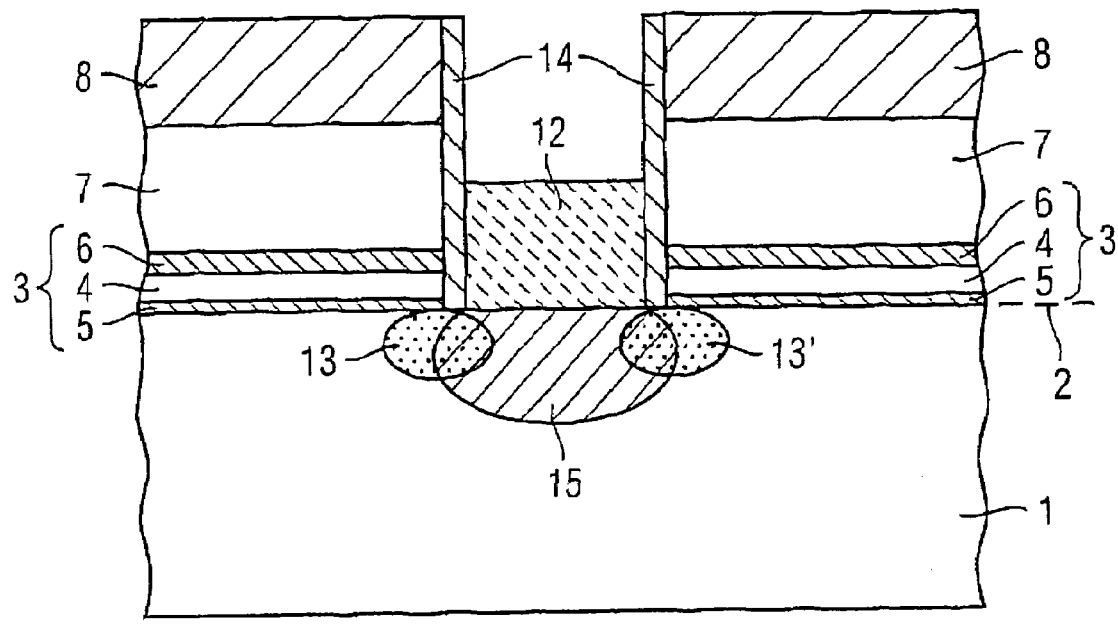

Referring to FIG. 2B, a conductive region 12 is formed on top of the doped semiconductor zone 15. The conductive region 12 may be formed of doped epitaxial silicon formed by selective epitaxy or it may be formed of doped polycrystalline silicon, for example. In the latter case the conductive region 12 may be formed in a two-step process by firstly filling up the trench 9 with a conductive material and secondly recessing the material to provide the conductive region 12 having a desired height. Preferably, the conductive region 12 comprises a top side below a corresponding top side of the conductive layer 7 to avoid exposure of the conductive region 12 after removal of the cap layer 8. The conductive region 12 is in direct electrical contact with the doped semiconductor zone 15, thereby reducing the resistance of the buried bitline.

Figure 2C:
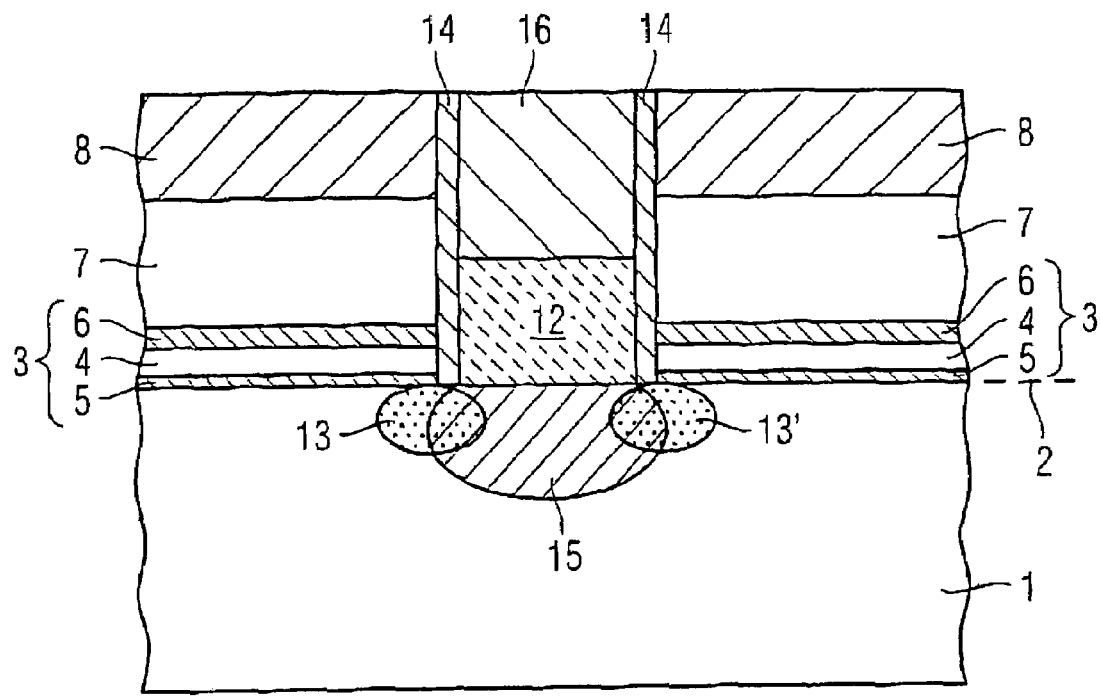

Reference is now taken to FIG. 2C. Here, the trench 9 is filled up with the dielectric material 16.

Figure 2D:
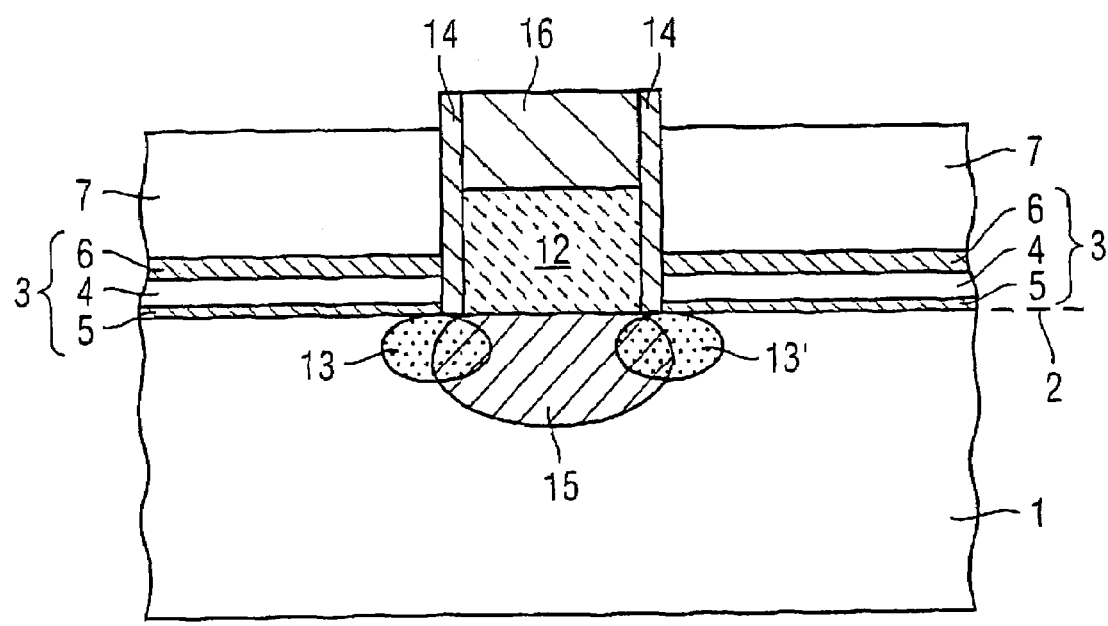

After filling up the trench 9, the cap layer 8 as well as part of the spacer structure 14 and part of the dielectric material 16 is removed, e.g., by CMP, see FIG. 2D. Thus, the conductive layer 7 is exposed.

Figure 2E:
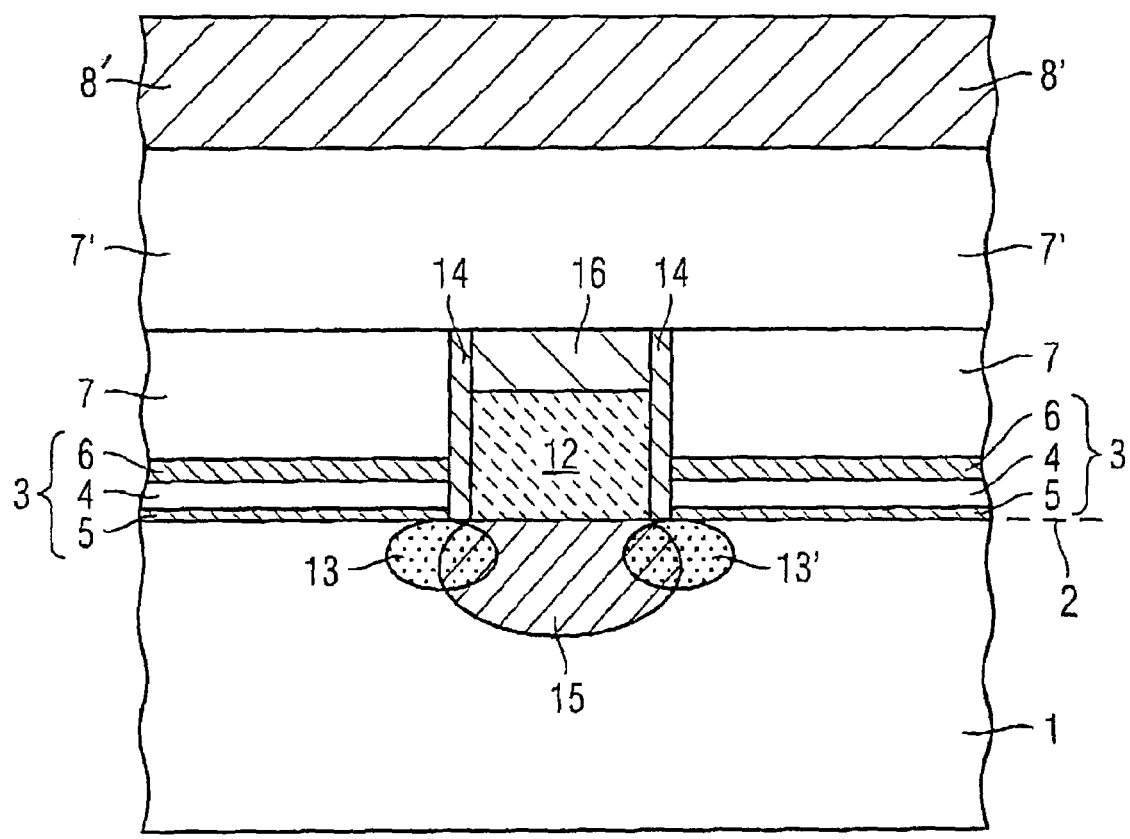

In subsequent process steps shown in the schematic cross-sectional view of FIG. 2E, a further conductive layer 7' is formed on the exposed conductive layer 7. On top of the further conductive layer 7', a further cap layer 8' is provided. The further cap layer 8' may serve as a hardmask when patterning the conductive layers 7, 7' to provide wordlines of the flash memory cell array, for example.

Although specific embodiments have been illustrated and described herein, it will be appreciated by those of ordinary skill in the art that a variety of alternate and/or equivalent implementations may be substituted for the specific embodiments shown and described without departing from the spirit and scope of the present invention. This application is intended to cover any adaptations or variations of the specific embodiments discussed herein. Therefore, it is intended that this invention be limited only by the claims and the equivalents thereof.

What is claimed is:

1. A method of forming buried bitlines of a flash memory cell array, the method comprising:
   providing a semiconductor substrate comprising a structure of a dielectric layer stack formed on a surface of the semiconductor substrate, a conductive layer formed on the dielectric layer stack, and a cap layer formed on the conductive layer;
   forming trenches into the structure to expose part of the semiconductor substrate;
   implanting dopants into the semiconductor substrate using a tilted implantation process to form pocket regions at opposing edges of the exposed part of the semiconductor substrate, wherein the pocket regions are non-overlapping with each other;
   forming an insulating spacer structure covering sidewalls of the trenches, wherein the insulating spacer structure adjoins to a sidewall of the dielectric layer stack and to part of the semiconductor substrate, and wherein the pocket regions are formed prior to forming the insulating spacer structure;
   after forming the insulating spacer structure, forming a doped semiconductor region within the exposed part of the semiconductor substrate;
   forming a conductive region within the trenches on the doped semiconductor region, the conductive layer partially filling up the trenches; and
   filling up the trenches with a dielectric material and removing the cap layer, part of the insulating spacer structure, and part of the dielectric material to expose the conductive layer.

2. The method according to claim 1, wherein the conductive region within the trenches is formed up to a height that is below a top of the conductive layer.

3. The method according to claim 2, wherein the conductive region within the trenches is formed up to a height that is below a top of the dielectric layer stack.

4. The method according to claim 2, wherein the conductive region is formed by selective epitaxial growth.

5. The method according to claim 2, wherein forming the conductive region comprises: filling up the trenches with a conductive material and implementing a recess etch, thereby removing part of the conductive material to provide the conductive region.

6. The method according to claim 1, wherein the dielectric layer stack is formed as a stack comprising oxide/nitride/oxide layers.

7. The method according to claim 6, wherein the doped semiconductor region is formed by implanting dopants.

* * * * *